United States Patent [19]

Smeltzer et al.

[11] Patent Number: 4,766,482
[45] Date of Patent: Aug. 23, 1988

[54] SEMICONDUCTOR DEVICE AND METHOD OF MAKING THE SAME

[75] Inventors: Ronald K. Smeltzer; Alvin M. Goodman, both of Princeton Township, Mercer County, N.J.; George L. Schnable, Lansdale Borough, Pa.

[73] Assignee: General Electric Company, Schenectady, N.Y.

[21] Appl. No.: 939,688

[22] Filed: Dec. 9, 1986

[51] Int. Cl.$^4$ ............................................. H01L 29/78
[52] U.S. Cl. .................................... 357/23.7; 357/4; 357/91; 357/63; 437/21; 437/941
[58] Field of Search ................... 357/23.1, 23.7, 4, 91, 357/63; 148/DIG. 150, DIG. 77; 437/21, 11, 938, 941

[56] References Cited

U.S. PATENT DOCUMENTS

| 3,909,307 | 8/1975 | Stein | 148/1.5 |
| 4,135,951 | 1/1979 | Stone | 148/1.5 |
| 4,177,084 | 12/1979 | Lau et al. | 357/4 |
| 4,183,134 | 1/1980 | Oehler et aL. | 29/571 |
| 4,328,610 | 5/1982 | Thompson et al. | 29/571 |
| 4,348,803 | 9/1982 | Sasaki | 29/574 |
| 4,469,527 | 9/1984 | Sugano et al. | 148/15 |
| 4,509,990 | 4/1985 | Vasudev | 148/1.5 |
| 4,523,963 | 6/1985 | Ohta et al. | 357/4 |

FOREIGN PATENT DOCUMENTS

| 0112743 | 9/1981 | Japan | 437/21 |
| 57-99779 | 6/1982 | Japan | 357/23.7 |
| 57-99778 | 6/1982 | Japan | 357/23.7 |
| 58-151064 | 9/1983 | Japan | 357/23.7 |

OTHER PUBLICATIONS

"Special Purpose Materials", U.S. Department of Energy Annual Progress Report DOE/ER-0048/1, Apr. 1980, pp. 19-26.
D. Lynn et al., "Thermionic Integrated Circuits: Electronics For Hostile Environments," IEEE Transactions on Nuclear Science, vol. NS-32, No. 6, Dec. 1985, pp. 3996-4000.
D. Jobson-Scott et al., "Neutron Irradiation As A Means Of Reducing The Incidence of Radiation Induced Breakdown In A Radiation Hard Power MOSFET", IEEE Transactions on Nuclear Science, vol. NS-32, No. 6, date considered Dec. 1985, pp. 3961-3964.
Y. Yamamoto et al., "Influence Of Implantation Induced Damage In Sapphire Upon Improvement Of Crystalline Quality Of Silicon On Sapphire," Applied Physics Letter, vol. 47, No. 12, Dec. 15, 1985, pp. 1315-1317.
H. Naramoto, et al., "Ion Implantation And Thermal Annealing Of $\alpha$-Al$_2$O$_3$ Single Crystals," Journal of Applied Physics, vol. 54, No. 2, Feb. 1983, pp. 683-698.
K. Nassau, Gems Made By Man, Chilton Book Company, 1980, pp. 74-75.
Y. Saito et al., "Coloration of Quartz By Metal-Ion Implantation," Japanese Journal of Applied Physics, vol. 24, No. 8, 1985, pp. 1115-1116.
Y. Saito et al., "Coloratioln of Sapphire By Metal-Ion Implantation," Japanese Journal of Applied Physics, vol. 24, No. 11, Nov. 1985, pp. L880-L882.

Primary Examiner—Andrew J. James
Assistant Examiner—Mark Prenty
Attorney, Agent, or Firm—Henry I. Steckler; James C. Davis, Jr.; Paul R. Webb, II

[57] ABSTRACT

A semiconductor device having a layer of semiconductor material disposed on an insulating substrate is disclosed. A means is provided within the insulating substrate for minimizing the collection of radiation-induced charge carriers at the interface between the layer of semiconductor material and the insulating substrate. This means significantly reduces the accumulation of positive charges in the insulating substrate which would otherwise cause back-channel leakage when the device is operated after being irradiated. Also, the means minimizes the collection of charge carriers injected from the insulating substrate into the semiconductor device disposed on the insulating substrate. A method of fabricating this semiconductor device is also disclosed.

5 Claims, 1 Drawing Sheet

SEMICONDUCTOR DEVICE AND METHOD OF MAKING THE SAME

The Government has rights in this invention pursuant to Subcontract No. A6ZV-700000-E-507 under Contract No. F04704-84-C-0061 awarded by the Department of the Air Force.

The present invention relates to a semiconductor device and a method of making the same. More particularly, the present invention increases the radiation hardness of a semiconductor device having a layer of semiconductor material disposed on an insulating substrate.

BACKGROUND OF THE INVENTION

Semiconductor devices having a layer of semiconductor material disposed on an insulating substrate are generally known in the art. An example of such a device is a silicon-on-insulator (SOI) semiconductor device which includes a silicon mesa formed on the surface of an insulating material. When the insulating material is a sapphire substrate, the structure is known as a silicon-on-sapphire (SOS) semiconductor device. Metal-oxide-semiconductor (MOS) transistors or other active devices are formed in and on the silicon mesa. MOS/SOI transistors generally have higher speed and improved radiation hardness in comparison with MOS transistors formed in bulk silicon.

MOS/SOI transistors have a higher degree of radiation hardness with respect to transient-type radiations (gamma pulses, x-ray pulses and high-energy single particles) because, when compared to bulk silicon devices, there is a smaller volume of silicon present in which photocurrent generation can occur. However, radiation-induced charge carriers are also generated within the insulating materials, such as the sapphire substrate. Some of the charges generated within the sapphire substrate are injected into the transistor formed in the silicon mesa. These injected charges can be collected at nodes and impose an upper limit to device performance in transient-type radiation environments. Also, radiation-induced positive charges accumulate in the sapphire substrate in the region adjacent the silicon mesa/sapphire interface when exposed to any type of high-energy radiation. The positive charge in the sapphire substrate attracts a corresponding negative charge in the region of the silicon mesa adjacent the interface. This accumulation of negative charges can in certain devices, such as N-channel transistors, create a back-channel or electron flow which is not controlled by the gate electrode.

Numerous solutions have been proposed to reduce back-channel leakage currents. However, most of these solutions are directed to the silicon mesa. For example, P. Vasudev in U.S. Pat. No. 4,509,990, entitled "Solid Phase Epitaxy and Regrowth Process With Controlled Defect Density Profiling For Heteroepitaxial Semiconductor On Insulator Composite Substrates," issued Apr. 9, 1985, discloses the use of a high defect density layer within the silicon mesa. This high defect density layer, which may be a residual damage interface layer or an annealed interface layer, is formed during the ion implantation step used in the solid-phase epitaxy growth process. The high defect density layer is positioned in the silicon mesa adjacent to the silicon/sapphire interface. The high defect density layer reduces the leakage current along the back-channel because the damaged crystal structure reduces the mobility of the charge carriers along this region.

Back-channel leakage currents can also be reduced by selectively doping portions of the silicon mesa. U.S. Pat. No. 4,183,134, entitled "High Yield Processing For Silicon-On-Sapphire CMOS Integrated Circuits," issued Jan. 15, 1980 to H. Oehler et al. is an example of such a process. In N-channel devices, P-type materials are ion implanted into the channel region adjacent the silicon/sapphire interface. This region near the silicon/sapphire interface has a heavier P-type doping concentration so as to increase the amount of radiation-induced positive charge within the sapphire substrate needed before the back-channel in the silicon mesa is turned on.

Since the back-channel leakage problem is attributed to charge carrier generation and trapping within the insulating substrate, it would be desirable to process the substrate in a manner to reduce the effect of these charge carriers on the silicon transistor. This would then allow for normal processing techniques to be used to form the semiconductor device within the silicon mesa, rather than using the processing techniques which employ a heavily doped region in the portion of the channel adjacent the silicon/sapphire interface or a defect region within the silicon layer.

SUMMARY OF THE INVENTION

The semiconductor device of the present invention includes a semiconductor device formed in a layer of semiconductor material which is disposed on an insulating substrate. A means is provided within the insulating substrate for minimizing both the accumulation of charge carriers within the insulating substrate and the collection of charge carriers injected from the insulating substrate into the layer of semiconductor material. The present invention also includes a method of fabricating the semiconductor device described above.

DETAILED DESCRIPTION OF THE PREFERRED EMBODIMENT

The present invention will be described using single-crystalline silicon as the semiconductor material which is disposed on an insulating substrate of single-crystalline sapphire. However, it should be understood that other conventional semiconductor materials, such as IIb-VIa and IIIa-Va semiconductor compounds, may be substituted for silicon. Additionally, other conventional insulator substrates, such as spinel, beryllium oxide and silicon dioxide disposed on a semiconductor material, may be substituted for sapphire.

Figure 1:
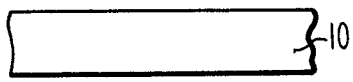
FIGS. 1a, 1b and 6-7 are cross-sectional views illustrating the various steps of the present invention for fabricating the semiconductor device with increased radiation hardness.
Figure 2A:
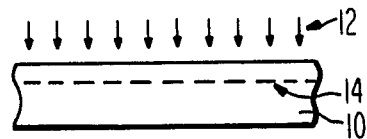
Figure 3A:
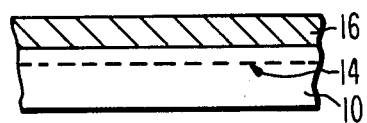

Referring to FIG. 1, the present invention begins with a single-crystalline sapphire substrate 10. The process may now proceed in two alternative sequences. The first sequence is illustrated by FIGS. 2A and 3A. Referring now to FIG. 2A, the sapphire substrate 10 is implanted with ions 12 to form a means 14 within the sapphire substrate 10 for minimizing both the accumulation of charge carriers within the sapphire substrate 10 and the collection of charge carriers injected from the sapphire substrate into the layer of single-crystalline silicon which is later formed on the sapphire substrate 10. The ions 12 may be inert, such as positive ions of helium, neon, argon or krypton. When these inert ions 12 are used, the means 14 is a buried region of crystal lattice defects. This buried region of crystal lattice defects traps charge carriers that are generated in the sapphire substrate 10 when the device is irradiated. Thus, fewer charge carriers can reach the silicon/sapphire interface and accumulate in the region of the sapphire substrate 10 adjacent the interface with the silicon layer. Also, the number of charge carriers that are available for injection into the overlying transistor, which is later formed in the silicon layer, is reduced.

The implant energies used to form the buried region must be carefully controlled. The buried region is spaced below the surface of the sapphire substrate 10 so as to avoid the introduction of crystallographic defects in the surface regions of the sapphire which would adversely affect the crystallographic quality of the subsequently deposited heteroepitaxial silicon layer. For example, when $^{40}Ar^+$ is used as the inert ion, a dosage in the range of about $1 \times 10^{14} - 5 \times 10^{14}$ cm$^{-2}$ and an energy of about 160 keV are used to form the buried regions. Alternatively, $^4He^+$ could be implanted into the sapphire substrate 10 using a dosage in the range of about $4 \times 10^{14} - 2 \times 10^{15}$ cm$^{-2}$ and an implant energy in the range of about 80–140 keV. Also, the buried region could be formed by implanting $^{20}Ne^+$ using a dosage of about $5 \times 10^{14}$ cm$^{-2}$ and an implant energy of about 180 keV.

As an alternative to the use of the inert ions in FIG. 2A, ions 12 of a material which act as a recombination center may be introduced as a dopant into the sapphire substrate 10 to form the means 14 for minimizing both the accumulation of charge carriers within the sapphire substrate 10 and the collection of charge carriers injected from the sapphire substrate 10 into the layer of single-crystalline silicon which is later formed on the sapphire substrate 10. Materials such as chromium, iron or manganese may be implanted into the sapphire substrate 10 to form the means 14 which is a buried region of recombination centers. Charge carriers which are generated during irradiation recombine within this buried region of recombination centers and do not collect in the sapphire substrate 10 near the interface with the silicon layer. The implant conditions are chosen so that the means 14 is spaced from the surface of the sapphire substrate 10 so as to not affect the subsequent heteroepitaxial growth process. As an optional step, the sapphire substrate 10 may be heated after implantation to a temperature of about 1500° C. in an oxygen atmosphere. During this heat treatment step there is a substitutional redistribution of the dopants in the sapphire lattice structure.

As shown in FIG. 3A, after the sapphire substrate 10 is implanted with ions of an inert material or of a material which act as a recombination center, a lyer of single-crystalline silicon 16 is formed on the sapphire substrate 10. The single-crystalline silicon layer 16 is epitaxially grown on the surface of the sapphire substrate 10 using conventional techniques. The silicon layer 16 has a thickness of about 4000–6000 Å.

Figure 2B:
Figure 3B:
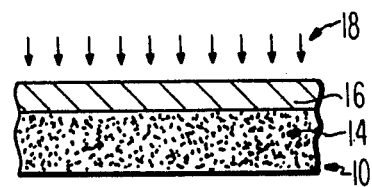

As an alternative to the process sequence illustrated by FIGS. 2A and 3A, a second process sequence illustrated by FIGS. 2B and 3B is provided. This process differs from the process illustrated in FIGS. 2A and 3A because the single-crystalline silicon layer 16 is formed on the sapphire substrate 10 before the means 14 is formed. As shown in FIG. 2B, the layer 16 of single-crystalline silicon is epitaxially grown on the sapphire substrate 10 using conventional chemical vapor deposition techniques.

Referring now to FIG. 3B, the composite structure comprising the silicon layer 16 and the sapphire substrate 10 is irradiated to form the means 14 for minimizing both the accumulation of charge carriers in the sapphire substrate 10 and the collection of charge carriers injected from the sapphire substrate 10 into the silicon layer 16. Neutrons or gamma rays 18 are used to form the means 14 which is a region of crystal lattice defects. This region of crystal lattice defects functions in the same manner as described above with regard to FIG. 2A to minimize the collection of charge carriers at the silicon layer/sapphire substrate interface. However, this region of crystal lattice defects does not have to be buried and spaced from the surface of the sapphire substrate since the silicon layer 16 has already been epitaxially grown. Typically, the crystal lattice defects would be found throughout the sapphire substrate 10. Any crystal lattice defects formed in the silicon layer 16 by the neutrons or gamma rays will be annealed out during the device processing steps illustrated by FIGS. 4–7.

If gamma rays 18 are used to form the means 14, the sapphire substrate 10 with the silicon layer 16 is placed in a cobalt-60 gamma cell or any other source of high-energy gamma rays. The structure is left in the reactor until an exposure level of about 10–100 MRad(Si) or higher is achieved using a dose rate of about 50–500 Rad(Si)/sec. Alternatively, the sapphire substrate 10 with the silicon layer 16 may be placed in a nuclear reactor, such as the TRIGA, when neutrons 18 are used to form the means 14. The reactor should preferably be operated in a steady state mode producing fast neutrons to avoid nuclear transmutation. Additionally, layers of Boral TM (composite material consisting of boron carbide crystals in aluminum, with a cladding of pure aluminum) and/or cadmium may be used to filter slow neutrons. A total fluence in the range of about $10^{14}$–$10^{17}$ n/cm$^2$ or higher may be used to form the means 14.

Figure 4:
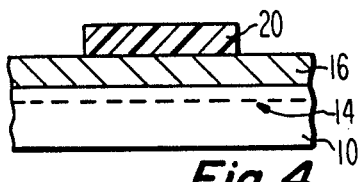
Figure 5:
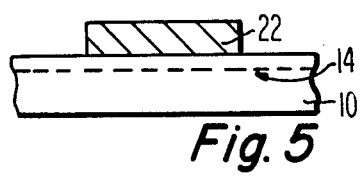

Once the means 14 and the silicon layer 16 have been formed, the device is then processed using the steps illustrated by FIGS. 4–7. The sapphire substrate 10 shown in FIGS. 4–7 contains the means 14 produced by the method illustrated in FIGS. 2A and 3A. However, the sapphire substrate 10 produced by the method illustrated in FIGS. 2B and 3B would be processed in the same manner. As shown in FIG. 4, a masking layer 20, such as silicon dioxide, is grown and selectively patterned on the silicon layer 16. The masking layer 20 covers the portion of the silicon layer 16 which will correspond to the mesa. The uncovered portions of the semiconductor layer 16 are then removed using a conventional anisotropic plasma or wet etchant. The masking layer 20 is then removed and the resulting structure, with the silicon mesa 22, is shown in FIG. 5.

Figure 6:
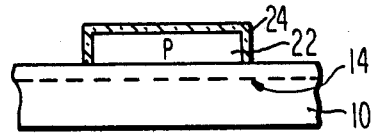

The structure shown in FIG. 5 is then heated to a temperature of about 850° C. in an atmosphere comprising oxygen and steam. As shown in FIG. 6, this step forms a silicon dioxide layer 24 which covers the top and side surfaces of the silicon mesa 22. The silicon mesa 22 is then doped P-type since an N-channel transistor is being fabricated.

Figure 7:
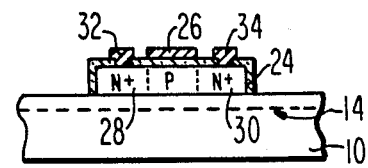

Referring now to FIG. 7, a gate electrode 26, such as N-type polycrystalline silicon, is deposited and patterned over the region of the silicon mesa 22 which corresponds to the channel region. Then, self-aligned N-type source and drain regions 28 and 30, respectively, are formed using conventional ion implantation techniques. Finally, source and drain contacts 32 and 34, respectively, are formed on the semiconductor layer.

The method illustrated above by FIGS. 1-7 is used to fabricate an NMOS device, but other conventional semiconductor devices, such as PMOS or bipolar transistors and CMOS integrated circuits, may be formed using the present invention. Additionally, the neutron or gamma irradiation step illustrated in FIG. 3B may be carried out before the silicon layer 16 is formed on the insulating substrate 10. In the same manner, the inert ions or the ions of the material which act as a recombination center may be introduced into the insulating substrate after the silicon layer 16 is formed. Other conventional techniques used to increase the radiation hardness of semiconductor devices, such as the heavily doped back-channel of U.S. Pat. No. 4,183,184, may be combined with the means 14 to produce a device with an even higher degree of radiation hardness.

When the process step illustrated in FIG. 2A is utilized, it may be desireable to selectively form the means 14 in only portions of the insulating substrate, such as only below the NMOS transistor in a CMOS integrated circuit. A masking layer, such as a conventional photoresist, is deposited and patterned so that the portions of the insulating substrate which are to remain free of the means 14 are covered. Then, the ions of a material which act as a recombination center or ions of an inert material are implanted into the areas of the insulating substrate which are not subtended by the masking layer using the conditions described earlier with regard to FIG. 2A. If the means 14 is formed after the semiconductor layer is fabricated on the insulating substrate, then the photoresist would be deposited and patterned on the semiconductor layer before the ion implantation step is carried out.

EXAMPLE

A group of silicon-on-sapphire wafers was subjected to a gamma radiation dose of 114.8 MRad(Si). Random-access memories (RAMs) were formed in both the gamma irradiated SOS wafers and in control SOS wafers which were unirradiated. Both the control devices and the devices formed in the gamma-irradiated wafers were then exposed to transient radiation in an electron linear accelerator operated with 4 $\mu$sec pulses. In comparison with the control devices, the RAMs built on the gamma-irradiated SOS wafers exhibited a reduction in photocurrents by a factor of 3. These data suggest that the number of charge carriers injected from the sapphire substrate into the silicon layer is significantly reduced.

The ability to process the insulating substrate to minimize both the accumulation of charge carriers in the insulating substrate and the collection of charge carriers injected from the insulating substrate into the layer of semiconductor material before the active device is formed is beneficial in making semiconductor devices radiation hard. By irradiating or ion implanting the substrate before the device fabrication step, no total-dose damage to the finished device is done.

It is known to form electron traps in bulk silicon devices by creating radiation-induced defects in the crystal lattice structure. However, special device processing techniques must be utilized to fabricate these devices because radiation-induced defects in silicon are known to anneal out at temperatures on the order of 500-600° C. However, Y. Yamamoto et al. in the article entitled, "Influence Of Implantation Induced Damage In Sapphire Upon Improvement Of Crystalline quality Of Silicon On Sapphire," Appl. Phys. Lett., Vol. 47, No. 12, Dec. 15, 1985, pp. 1315-1317, suggest that ion implantation induced damage, which can occur in the sapphire substrate during a solid-phase regrowth process, is hard to anneal out during a 1000° C. post thermal annealing step. Since the crystal damage in the present invention is formed in the insulating substrate, such as sapphire, rather than in semiconductor layer, such as silicon, conventional processing temperatures can be used to fabricate the active devices without the radiation-induced or ion-induced crystal lattice damage in the substrate annealing out at high temperatures.

We claim:
1. A semiconductor device, comprising:
   a layer of semiconductor material disposed on an insulating substrate;
   a plurality of recombination center means disposed within said insulating substrate for minimizing both the accumulation of charge carriers in said insulating substrate and the collection of charge carriers injected from said insulating substrate into said layer of semiconductor material; and
   a semiconductor structure disposed in said layer of semiconductor material directly above said means.
2. A semiconductor device according to claim 1, wherein said structure comprises:
   a gate oxide disposed on at least a portion of said layer of semiconductor material;
   a gate electrode disposed on said gate oxide; and
   source and drain regions disposed in said layer of semiconductor material.
3. A semiconductor device according to claim 1 wherein said insulating substrate is a material selected from the group consisting of sapphire and spinel and said layer of semiconductor material is single-crystalline silicon.
4. A semiconductor device according to claim 1 wherein said means is disposed in only selected portions of said insulating substrate.
5. A semiconductor device, comprising:
   a layer of semiconductor single-crystalline silicon material disposed on an insulating substrate selected from the group consisting of sapphire and spinel;
   a recombination center means comprising dopants selected from the group consisting of chromium, iron and manganese and disposed within said insulating substrate for minimizing both the accumulation of charge carriers in said insulating substrate and dthe collection of charge carriers injected from said insulating substrate into said layer of semiconductor material; and
   a semiconductor structure disposed in said layer of semiconductor material directly above said means.

* * * * *